United States Patent [19]

McLeod et al.

[11] Patent Number: 4,658,086

[45] Date of Patent: Apr. 14, 1987

[54] PHOTOVOLTAIC CELL PACKAGE ASSEMBLY FOR MECHANICALLY STACKED PHOTOVOLTAIC CELLS

[75] Inventors: Paul S. McLeod, Berkeley; John A. Cape, San Rafael; Lewis M. Fraas, El Sobrante; Larry D. Partain, Richmond, all of Calif.

[73] Assignee: Chevron Research Company, San Francisco, Calif.

[21] Appl. No.: 740,362

[22] Filed: Jun. 3, 1985

[51] Int. Cl.[4] .......................................... H01L 25/02
[52] U.S. Cl. .................................. 136/249; 136/244; 357/30; 357/75; 357/76; 357/81
[58] Field of Search ........................ 136/249 TJ, 244; 357/30, 75, 76, 81

[56] References Cited

U.S. PATENT DOCUMENTS

| | | | |
|---|---|---|---|
| 4,094,704 | 6/1978 | Milnes | 136/244 |
| 4,338,480 | 7/1982 | Antypas et al. | 136/249 TJ |
| 4,461,922 | 7/1984 | Gay et al. | 136/249 TJ |
| 4,547,622 | 10/1985 | Fan et al. | 136/249 TJ |

Primary Examiner—Aaron Weisstuch
Attorney, Agent, or Firm—S. R. LaPaglia; E. J. Keeling; A. S. Zavell

[57] ABSTRACT

A mechanically stacked module package is described. The package permits the effective mechanical stacking of two solar cells in a compact arrangement. The design also permits the easy wiring of the package into a voltage matching configuration for module wiring thus eliminating the problems of current matching the top and bottom cells. The package design can be used with any mechanically stacked cells although the design is most suitable for concentrator solar cell configurations where the removal of heat to avoid degradation and shortening of lifetime is a major concern.

11 Claims, 4 Drawing Figures

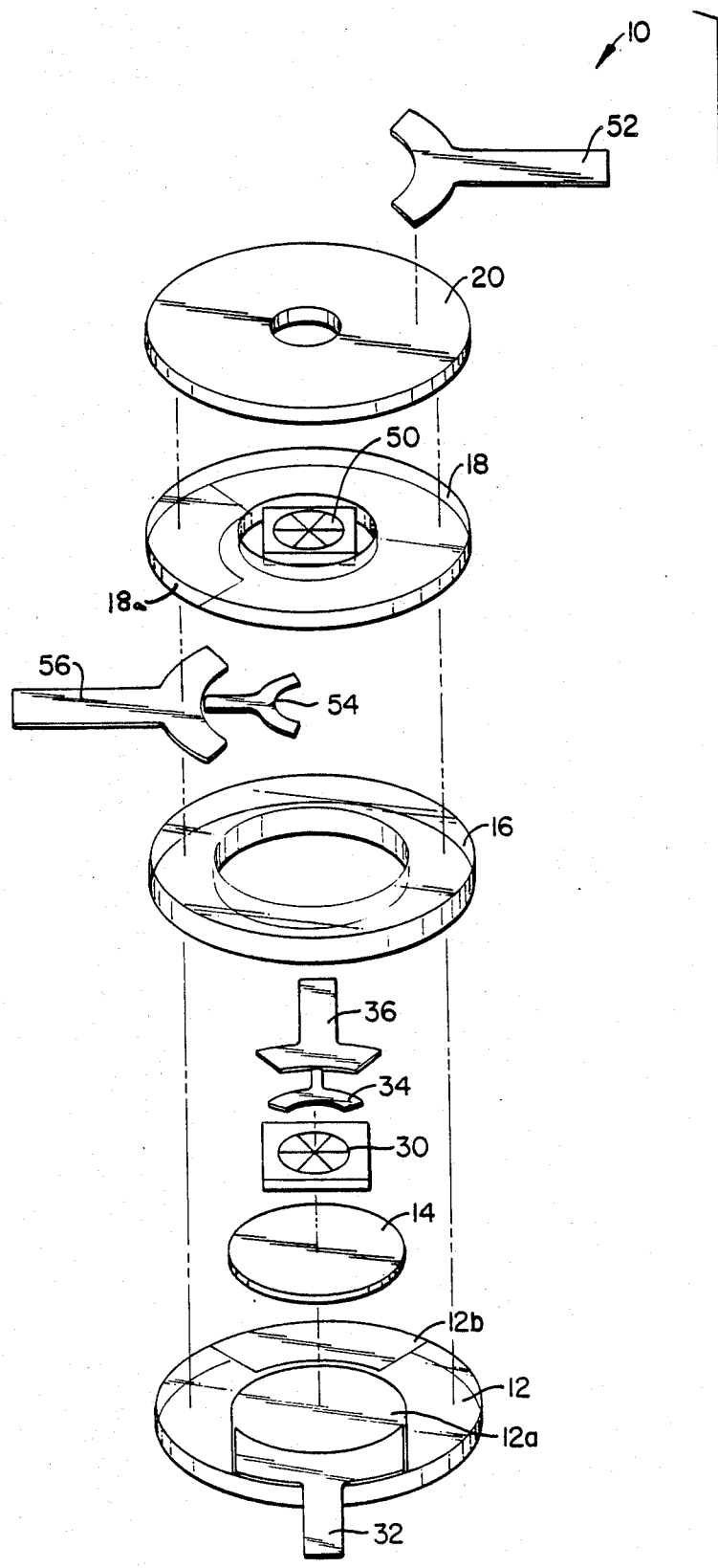
FIG._1.

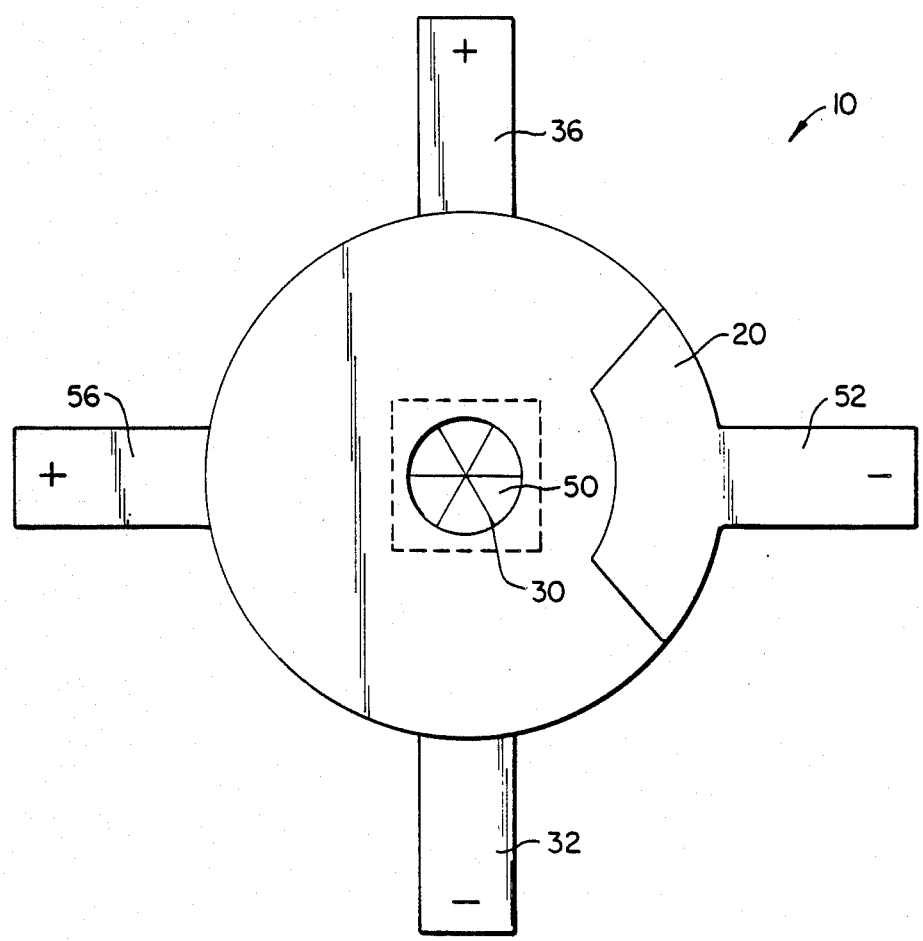
FIG._3.
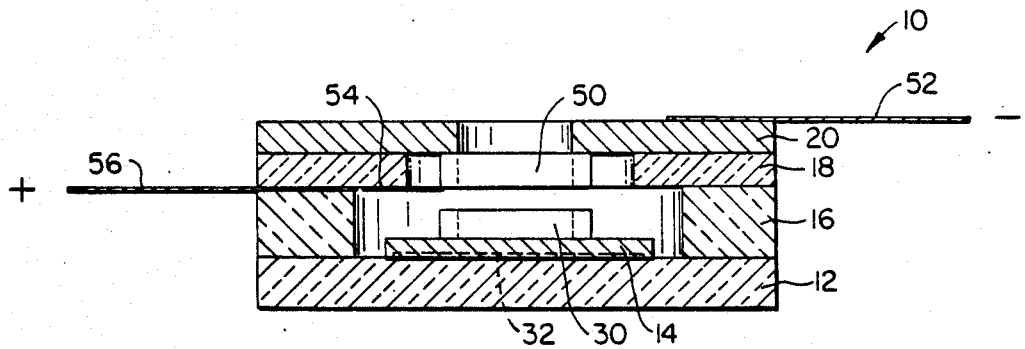
FIG._2.

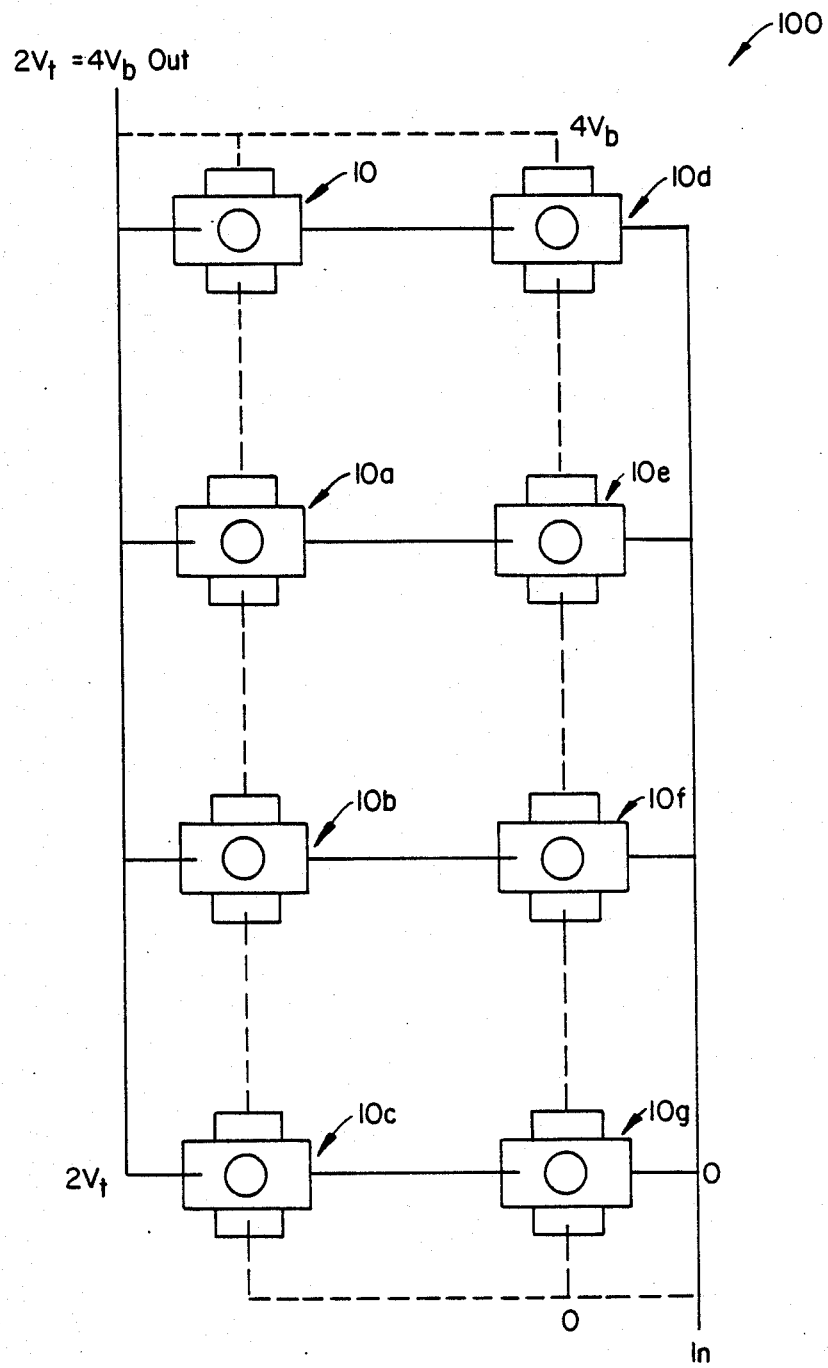
FIG._4.

PHOTOVOLTAIC CELL PACKAGE ASSEMBLY FOR MECHANICALLY STACKED PHOTOVOLTAIC CELLS

This invention relates to photovoltaic cells. More specifically, this invention relates to mechanically stacked photovoltaic cells.

BACKGROUND OF THE INVENTION

To increase the overall efficiency of photovoltaic devices and extract the maximum amount of energy from solar radiation, researchers have investigated various multi-color photovoltaic devices. These multicolor photovoltaic devices can be divided into two general categories. The first category covers monolithic multi-color solar cells. A monolithic multi-color solar cell is a solar cell which has distinct regions optimized to absorb different portions of the solar radiation spectrum in a single device. U.S. Pat. Nos. 4,404,421 and 4,451,691, incorporated herein by reference for all purposes, describe suitable monolithic devices. Although these monolithic devices are attractive from a system and manufacturing point of view, they will require considerable materials research to bring them to commercialization.

A second approach involves tandem mechanically stacked two-color solar cells. These devices comprise independent photovoltaic devices which optimized to different portions of the solar spectrum and are mechanically and electrically interconnected. These tandem mechanically stacked two-color solar cells offer a shorter path to commercialization primarily because the low-band gap cells, such as silicon solar cells, are already developed cells. U.S. application Ser. No. 645,456 filed Aug. 28, 1984, incorporated herein by reference for all purposes, describes a suitable high-band gap solar cell. Examples of high-band gap solar cells are GaAsP or AlGaAs or GaAs solar cells, and the like.

These mechanically stacked cells often fall into the category of solar cells known as concentrator solar cells. A concentrator solar cell is a high efficiency solar cell which utilizes some sort of a focusing optics to concentrate solar radiation from a strength of one sun to many suns, i.e., on the order of 50 to 1000 or more suns. The concentration of the solar radiation permits the solar cells to produce a greater amount of electricity per unit area than lower efficiency flat plate solar cells. This makes them especially useful for space applications where weight is of great concern and in jobs which require maximum electrical output with a minimum amount of surface area. However, a drawback to concentrator solar cells is a means for interconnecting the two mechanically stacked solar cells and dissipating the heat generated by the concentration of the solar radiation. Thus, it would be highly desirable to have a mechanically stacked apparatus which can interconnect two solar cells while minimizing the effects of heat generated by the concentrated solar radiation.

In conventional mechanical stack designs, in particular, those using thin top cells, the heat generated in the top cell must be transmitted through the transparent adhesive bonding the two cells together. This can lead to undesirably high cell temperatures. To avoid this difficulty, it would be highly desirable to have a package design wherein heat spreaders incorporated therein are used both for the bottom and top cells. A further advantage would be to incorporate a wafer for the top cell that is thick enough to conduct the heat laterally to the second heat spreader. A still further advantage or object would be to have a design which isolates the cells so that the effects of thermal expansion are reduced or minimized.

In mechanical or monolithic cell designs, the top and bottom cells must generally be current matched or the performance of the device is limited by the cell having the lower current. Since current matching different bandgap solar cells can be extremely difficult, it would be desirable to have a package which permits voltage matching of the two cells. Voltage matching is beneficial because the voltages of the cells change very little with variations in solar spectrum or with the cell degradation with space radiation damage. Thus, it would also be highly desirable to have a package design which can dissipate the heat and permit the easy wiring of numerous mechanically stacked cells into a module wiring configuration for voltage matching instead of current matching.

SUMMARY OF THE INVENTION

We have invented a mechanically stacked photovoltaic cell package assembly for mechanically stacking solar cells which incorporates the above enumerated desirable features and other benefits which are readily apparent to the ordinary skilled artisan. The mechanically stacked apparatus includes top and bottom heat spreaders, insulating means to separate the two solar cells and means for forming electrical contacts to the exposed surfaces of each of the photovoltaic devices incorporated into the assembly. The means for forming electrical contact permit the easy interconnection of the completed device in a voltage matching scheme to avoid the requirements of current matching the individual photovoltaic cells.

BRIEF DESCRIPTION OF THE DRAWINGS

FIG. 1 illustrates an exploded view of the photovoltaic cell package assembly for mechanically stacked photovoltaic cells of our invention.

FIG. 2 illustrates a cross sectional view of the assembly.

FIG. 3 illustrates a top view of the assembly.

FIG. 4 illustrates a voltage matching module wiring diagram incorporating eight mechanically stacked photovoltaic assemblies.

DETAILED DESCRIPTION OF THE INVENTION

The invention will be more clearly illustrated by referring to the figures. FIGS. 1, 2, and 3 illustrate an exploded view, a cross sectional view and a top view, respectively, of a mechanically stacked solar cell package 10. The package 10 includes a base support member 12 of a suitable insulating material such as alumina ($Al_2O_3$). The base support member 12 contains regions of metallization 12a and 12b. These regions provide a means for forming electrical contact to the bottom solar cell 30 through the bottom heat sink 14 and the electrode leads 32, 34, and 36. The metallization regions 12a and 12b can have any shape which permits the formation of electrical contact thereto, although the illustrated configuration is preferred for the contacts and heat sinks illustrated. A suitable metallization is gold, silver, nickel plating, and the like. The insulating base member can be soldered to a suitable heat sink, not illustrated, such as a nickel-plated heat sink.

Contacting the base support means 12 through the metallization 12a is an electrically conductive heat spreader 14. A suitable bottom contact heat spreader is fabricated from a suitable thermal expansion matching conductor such as molybdenum. The heat spreader 14 also functions as a part of the means for forming an electrical contact to the major surface of the solar cell which is opposed to solar radiation. Surrounding this bottom contact heat spreader 14 is a spacer means 16. Preferably the spacer 16 is fabricated from an insulating material such as alumina or high temperature plastic and provides a space therein surrounding the bottom contact heat spreader 14 in which to position a low-band gap solar cell illustrated as photovoltaic device 30. The bottom cell 30 is in electrical contact with the heat spreader 14 and an electrode or lead 32 for wiring into a module.

The bottom solar cell 30 is electrically contacted with suitable means for forming an electrical contact to the portion of the solar cell opposite to the incident surface. This combination comprises the heat spreader 14, metallization 12a, and a lead 32. The incident surface of the solar cell is electrically wired into a module through top leads, i.e., contacts 34 and 36. Lead 34 electrically contacts the incident surface of solar cell 30 and the outer lead 36 through the metallization 12b. This preferred configuration permits the solar cell 30 to be isolated from the rest of the package 10 and thus minimizes the thermal expansion strains placed upon the cell 30 during the heating thereof caused by solar radiation. Although less preferred, the contacts 34 and 36 can be configured if desired as a unitary piece. Of course, if leads 34 and 36 were a single piece of metal then the metallization 12b would be unnecessary. The preferred configuration of the top and bottom leads to the bottom cell 30 is illustrated. Of course, depending upon the packaging the leads 32, 34, and 36 need not be opposed but could be fabricated over but separated from each other. A further option, not illustrated, would be to have the metallization illustrated as 12b on support 12 applied instead on the insulating spacer 16. This option would avoid the tab portion of lead 34 from having to bend down from the incident surface of solar cell 30 to the metallization 12b on support member 12.

A second insulating spacer means 18 such as alumina, a high temperature plastic, and the like, separates the bottom cell 30 from the top cell 50. The top cell 50 is electrically contacted on the bottom, i.e., the major surface opposite the incident surface through leads 54 and 56 and the metallization 18a on the spacer 18. These bottom leads can also be configured as a single unitary piece. The incident surface of the solar cell is in electrical contact with an incident heat spreading means 20 for spreading the heat from the top solar cell 50 and the lead 52. A suitable heat spreader means 20 is a molybdenum heat sink in contact with top cell 50. The lead 52 can be any suitable metal. Of course, the incident heat spreader 20 has a hole therein, as illustrated, for the passage of solar radiation.

Although the package assembly 10 has been described and illustrated with spacers and heat spreaders, i.e., heat sinks, having a circular washer shaped configuration, any suitable configuration for the spacers and heat sinks is possible provided they contain a space therethrough for which the solar radiation to enter into the top cell 50 and pass to the bottom cell 30. The contacts have preferably been illustrated having a Y-shaped configuration; however, any suitable configuration for contacting the appropriate tops and bottoms of the cells is possible such as a rectangular a square tab shape. Furthermore, their thicknesses can be adjusted to provide a more compact or robust assembly as required for a particular application.

The selection of the top and bottom cells is a function of that portion of the solar radiation spectrum for which the package assembly is to be optimized. A preferred top solar cell would be a gallium arsenide phosphide $(GaAs_{(x)}P_{(1-x)})$ solar cell having a band gap of about 1.75 eV fabricated on a gallium phosphide (GaP) substrate with a larger band gap, i.e., about 2.25 eV so that it appears transparent to solar radiation which would pass therethrough and into the bottom cell 30. A suitable preferred bottom cell would be an IR enhanced silicon solar cell having a band gap of about 1.1 eV.

A benefit of the package design 10 permits module wiring configurations illustrated in FIG. 4. The package design 10 avoids the requirement for current matching of the top and bottom cells and replaces it with a voltage matching configuration. This wiring scheme benefits from the advantage that the voltage changes very little with variations in the solar spectrum or device degradation. It requires four independent leads from the cell package which is consistent with the package design described above.

More specifically, if the stacked cells were designed for series connection with currents matched at the beginning of life, the currents would be mismatched at the end of life, with performance loss greater than the efficiency loss of the individual cells. Voltage matching provides a longer life design since the device voltages only vary logarithmically with current changes. FIG. 4 illustrates a four by two module wiring diagram for voltage matching of top and bottom cells whose output voltages differ by a factor of 2. In the arrangement of FIG. 4, four silicon solar cells are wired in series for every Ga $As_xP_{1-x}$ solar cells wired in series. A voltage factor difference of 2 can be achieved with a gallium arsenide phosphide top solar cell 50 selected to have a band gap of about 1.75 eV and a bottom solar cell 30 of silicon selected to have a band gap of about 1.1 eV. For the eight element configuration illustrated, four of the bottom and two of the top cells are connected in series to provide voltage matching. Different voltage ratios for different solar cells would require other series and parallel connection schemes for voltage matching, e.g., four by three, seven by five, five by three, etc. The only limitations on the interconnection schemes are the voltages of the different cells. Of course, different modules having specific output currents and voltages can be connected in series or parallel to provide any desired overall voltage or current output for a particular application.

The solar cell package design has been described with reference to particularly preferred configurations and embodiments. Modifications which would be obvious to the ordinary skilled artisan, such as selection of particular top and bottom solar cells and configuration of the spreaders and insulators are contemplated to be within the scope of the invention.

What is claimed is:

1. An apparatus comprising mechanically stacked solar cells, comprising:
    a base support having opposed major surfaces;
    a first heat spreader-electrical contact contacting said base support on a major surface thereof which is incident to solar radiation;

means for electrically contacting said first heat spreader-electrical contact;

a first insulating spacer surrounding said heat spreader-electrical contact, said first insulating spacer having a space therein for a photovoltaic cell;

a first photovoltaic cell having opposed major surfaces and electrically contacting said heat spreader-electrical contact on its major surface opposed to solar radiation, said first photovoltaic cell having a band gap energy responsive to solar radiation of predetermined wavelengths;

means for electrically contacting the other major surface of said first photovoltaic cell which is incident to solar radiation;

a second insulating spacer contacting said first insulating spacer and having a space therein for a second photovoltaic cell;

a second photovoltaic cell having opposed major surfaces, said second photovoltaic cell having a band gap energy responsive to solar radiation of shorter wavelengths than said first photovoltaic cell;

means for electrically contacting the major surface of said second photovoltaic cell which is opposed to solar radiation;

a second heat spreader-electrical contact contacting said second insulator and the major surface of said photovoltaic cell which is incident to solar radiation, said heat spreader-electrical contact having a space therein to provide for the passage of solar radiation to said first and second photovoltaic cells; and means for electrically contacting said second heat spreader-electrical contact.

2. The apparatus according to claim 1 where said means for electrically contacting said first and second photovoltaic cells and said first heat spreader-electrical contact comprise metallizations on said base support and said second insulating spacer.

3. The apparatus according to claim 2 wherein said means for electrically contacting the incident surface of said first photovoltaic cell and said means for electrically contacting the major surface opposed to solar radiation of said second photovoltaic cell each comprise at least two metallic tabs in electrical contact with each other and in respective contact with said metallizations on said base support and said second insulating spacer.

4. The apparatus according to claim 3 wherein said second heat spreader-electrical contact and said first and second insulating spacers have a circular washer shaped configuration.

5. The apparatus according to claim 4 wherein said means for electrically contacting said first and second heat spreader-electrical contacts and said first and second photovoltaic cells have a Y-shaped configuration.

6. The apparatus according to claim 5 wherein said second photovoltaic cell is a $GaAs_{(x)}P_{(1-x)}$ solar cell on a GaP substrate and said first photovoltaic cell has a band gap lower than said $GaAs_{(x)} P_{(1-x)}$ cell.

7. The apparatus according to claim 6 wherein the composition of the $GaAs_{(x)}P_{(1-x)}$ cell is adjusted to provide an output voltage under illumination which is twice the voltage of said first photovoltaic cell.

8. The apparatus according to claim 7 wherein said first photovoltaic cell is a silicon solar cell having a band gap of about 1.1 eV and said $GaAs_{(x)}P_{(1-x)}$ solar cell has a band gap of about 1.75 eV 9. The apparatus according to claim 8 further comprising wiring four silicon solar cells in series for every two $GaAs_{(x)}P_{(1-x)}$ solar cells wired in series to form a module of predetermined output voltage under illumination.

10. A kit having component parts capable of being assembled in conjunction with first and second photovoltaic cells to form a mechanically stacked photovoltaic device, said kit comprising:

a base support;

a first heat-spreader-electrical contact adapted to be electrically joined to said base support;

first and second insulating spacers adapted to contain photovoltaic cells;

a second heat spreader-electrical contact adapted to electrically contact the photovoltaic cell which is incident to solar radiation; and means for electrically contacting said first and second photovoltaic cells.

11. The kit according to claim 10 further including a $GaAs_{(x)}P_{(1-x)}$ photovoltaic cell and a silicon photovoltaic cell.

* * * * *